United States Patent [19]
Durham et al.

[11] Patent Number: 6,049,230
[45] Date of Patent: Apr. 11, 2000

[54] SILICON ON INSULATOR DOMINO LOGIC CIRCUITS

[75] Inventors: Christopher McCall Durham; Peter Gürsen Klim, both of Austin; Binta Minesh Patel, Round Rock, all of Tex.

[73] Assignee: International Business Machines Corporation, Armonk, N.Y.

[21] Appl. No.: 09/036,448

[22] Filed: Mar. 6, 1998

[51] Int. Cl.[7] .................................. H03K 19/096
[52] U.S. Cl. .................. 326/98; 326/121; 326/112; 327/534
[58] Field of Search ................... 326/93, 95, 112, 326/119, 121, 98, 81, 82; 327/534, 535

[56] References Cited

U.S. PATENT DOCUMENTS 3,702,990 11/1972 Ross ........................... 326/534
5,395,772 3/1995 Miyazawa et al. .
5,917,365 6/1999 Houston ........................ 327/534

*Primary Examiner*—Michael Tokar
*Assistant Examiner*—Don Phu Le
*Attorney, Agent, or Firm*—Anthony V.S. England; Antony P. Ng; Andrew J. Dillon

[57] ABSTRACT

A domino logic circuit having a clocked precharge is disclosed. The domino logic circuit includes a precharge transistor, a discharge transistor, multiple input transistors, and a supplemental precharge transistor. Connected to a power supply, the precharge transistor receives a clock input. The discharge transistor is connected to ground and also receives the clock input. The input transistors, which are coupled between the precharge transistor and the discharge transistor, each receives a signal input. The supplemental precharge transistor is connected to the power supply and to a body of each of the input transistors. The supplemental precharge transistor also receives the same clock input as the precharge transistor.

18 Claims, 5 Drawing Sheets

SILICON ON INSULATOR DOMINO LOGIC CIRCUITS

BACKGROUND OF THE INVENTION

1. Technical Field

The present invention relates to semiconductor circuits in general, and in particular to silicon on insulator semiconductor circuits. Still more particularly, the present invention relates to a silicon on insulator domino logic circuit.

2. Description of the Prior Art

Domino logic circuits are commonly found in integrated circuits. A domino logic circuit simplifies digital logic by connecting a number of transistors together in series to implement digital combination logic. For example, a domino logic circuit implements a logic AND function by simply cascading a p-channel transistor with several n-channel input transistors in series. During operation, the p-channel transistor is clocked to precharge an output node of the circuit to a predetermined logic state. Depending on the logic state at the inputs of the n-channel input transistors, the output node either remains at its precharged state or is pulled low through the series of n-channel input transistors by a clocked n-channel transistor connected to ground.

In recent years, the predominant processing technology for integrated circuits has been the complementary metal oxide silicon (CMOS) technology. Although CMOS technology offers various advantages, such as low power consumption and stability, over other types of processing technologies, one major drawback of CMOS domino logic circuits is the effect of charge sharing. The present disclosure describes an improved domino logic circuit that is implemented with a so-called silicon on insulator (SOI) technology. A detailed description of the SOI technology can be found in Weste and Eshraghian, *Principles of CMOS VLSI Design: A Systems Perspective*, 2nd ed., pp. 125–130, Addison Wesley (1995), the pertinent portion of which is incorporated herein by reference. Instead of using silicon as a substrate like the CMOS technology, SOI utilizes an insulating substrate, which provides tremendous improvements in certain process characteristics, such as latch-up and speed, over the CMOS technology. In addition to overcoming the problem of charge sharing, the improved domino logic circuit is also able to generate an output signal faster than a conventional CMOS domino logic circuit.

SUMMARY OF THE INVENTION

In view of the foregoing, it is therefore an object of the present invention to provide an improved semiconductor circuit.

It is another object of the present invention to provide an improved silicon on insulator semiconductor circuit.

It is yet another object of the present invention to provide an improved silicon on insulator domino logic circuit.

In accordance with a preferred embodiment of the present invention, a domino logic circuit includes a precharge transistor, a discharge transistor, multiple input transistors, and a supplemental precharge transistor. Connected to a power supply, the precharge transistor receives a clock input. The discharge transistor is connected to ground and also receives the clock input. The input transistors, which are coupled between the precharge transistor and the discharge transistor, each receives a signal input. The supplemental precharge transistor is connected to the power supply and to a body of each of the input transistors. The supplemental precharge transistor also receives the same clock input as the precharge transistor.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read a conjunction with the accompanying drawings, wherein.

DETAILED DESCRIPTION OF A PREFERRED EMBODIMENT

Figure 1:
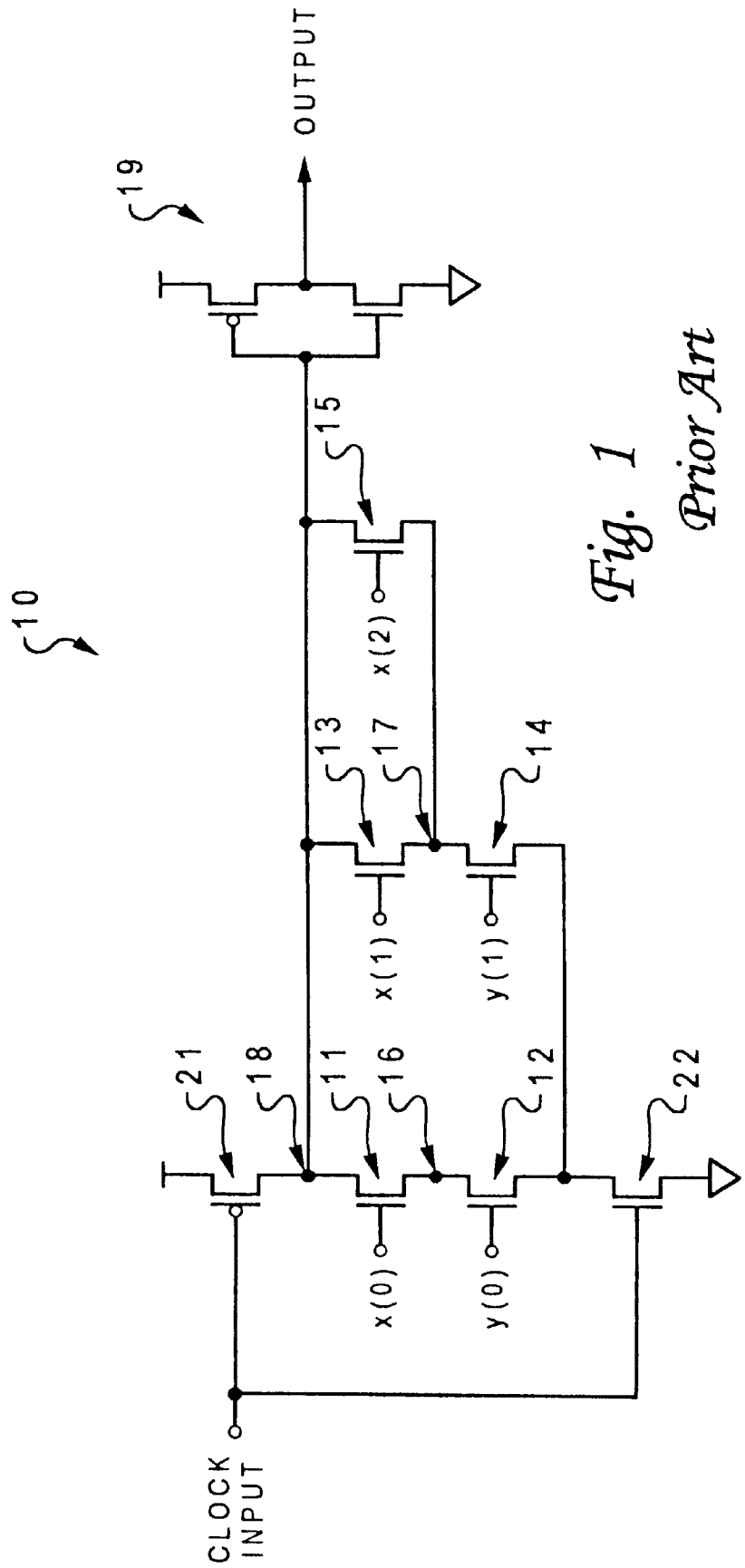
FIG. 1 is a circuit diagram of a five-input CMOS domino logic circuit according to the prior art.

Referring now to the drawings and in particular to FIG. 1, there is depicted a circuit diagram of a conventional five-input complementary metal-oxide semiconductor (CMOS) domino logic circuit. As shown, domino logic circuit 10 includes input transistors 11–15. Input transistors 11–15 are generally n-channel enhancement mode devices (NMOS), each having a respective input x( ) or y( ). When a logic high signal is applied to any one of inputs x( ) or y( ), an associated one of input transistors 11–15 is turned on. In other words, a conduction channel is formed between the source and drain terminals of the respective input transistor.

An output indication of the conduction within some of input transistors 11–15 can be determined at node 18. Node 18 is also connected to a p-channel (PMOS) precharge transistor 21 having a drain connected to a supply voltage $V_{dd}$. When precharge transistor 21 is driven into conduction by a logic low signal at its gate, the supply voltage $V_{dd}$, coupled through precharge transistor 21, will manifest at node 18. Node 18 is thus precharged to a voltage which represents a logic high. According to the conventional operation of CMOS circuits, when precharge transistor 21 is turned off, node 18 will remain precharged to the supply voltage $V_{dd}$ until some of input transistors 11–15 are driven into conduction. An inverter 19, created by a PMOS/NMOS transistor pair, is connected between node 18 and the output of domino logic circuit 10. Thus, the complement of a signal appearing at node 18 appears at the output of inverter 19.

A clock input is connected to the gate of precharge transistor 21, as well as to the gate of a discharge transistor 22. In this example, the drain of discharge transistor 22 is connected to the source of input transistor 12 and input transistor 14; and the source of discharge transistor 22 is connected to ground. Thus, when a logic high signal is applied to the gate of discharge transistor 22, discharge transistor 22 is driven into conduction, thereby grounding the source of input transistors 12 and 14.

The logic equation for domino logic circuit 10 is $[x(0) \cdot y(0)] + [[x(1)+x(2)] \cdot y(1)]$. In performing this logic function, a precharge clock signal is applied at the clock input by a precharge clock (not shown). During the low portion of the precharge clock signal, precharge transistor 21 is rendered conductive, discharge transistor 22 is made non-conductive, and node 18 will be precharged to a supply voltage of $V_{dd}$. Conversely, during the high portion of the precharge clock signal, precharge transistor 21 is rendered non-conductive, discharge transistor 22 is made conductive, and the source of input transistors 12 and 14 will be set to a logic low. It is during the high portion of the precharge clock signal when digital input signals should be applied to inputs x( ) and y( ). For example, if logic high signals are applied to inputs x(0) and y(0) only, input transistors 11 and 12 will be turned on such that discharge transistor 22 will pull node 18 to a logic low. Inverter 19 then inverts the logic low at node 18 to provide a logic high at the output of inverter 19. As a result, the logic function is thereby realized.

Figure 2:
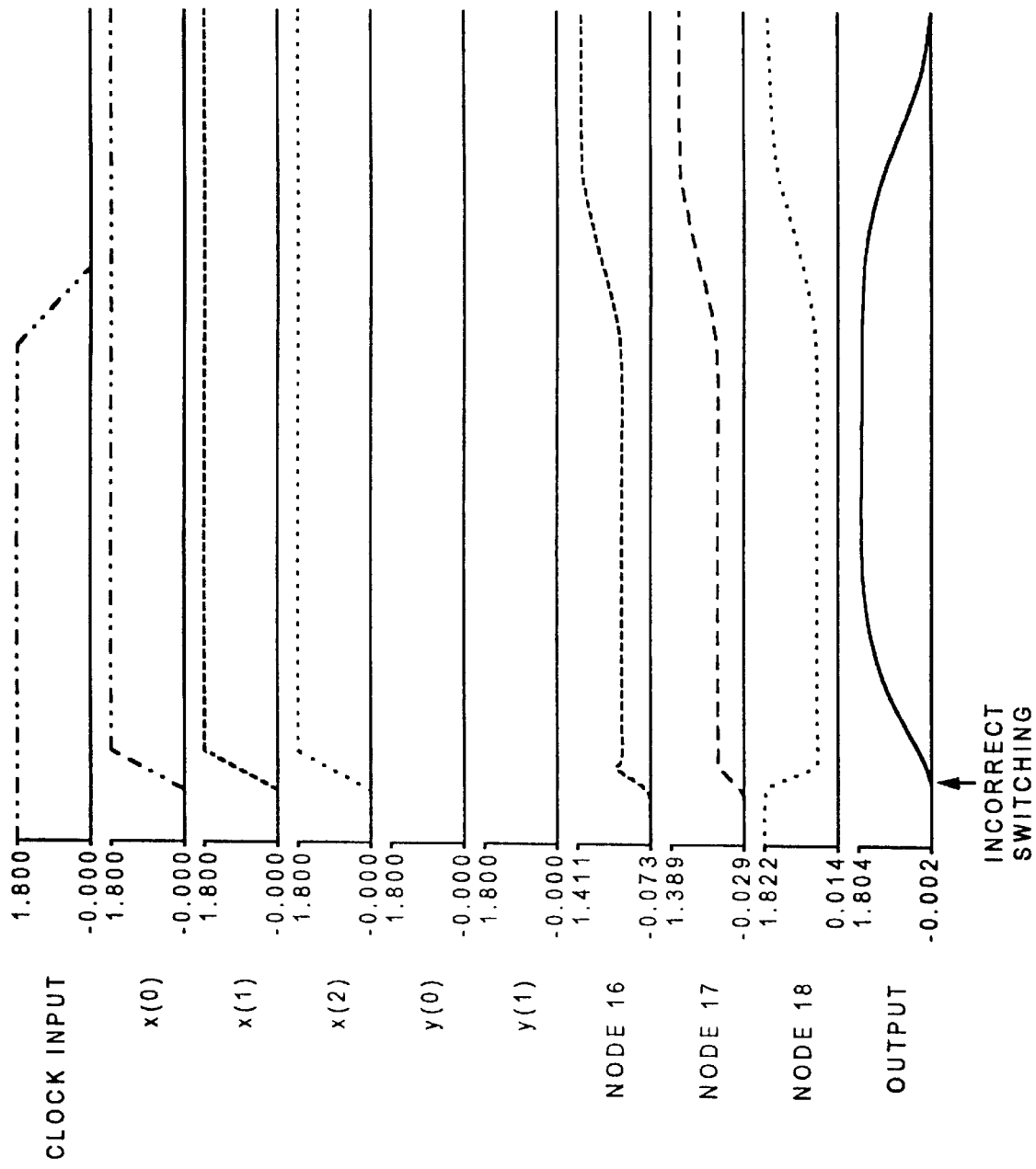
FIG. 2 is a timing diagram for the five-input CMOS domino logic circuit from FIG. 1.

Now if inputs y(0) and y(1) remain logic low, and input x(0), x(1), and x(2) transition to a logic high during the evaluation cycle, then the parasitic capacitance on nodes 16 and 17 will share or redistribute the charge stored on node 18. If this charge sharing event is sufficient enough to drop the signal value of node 18 below the switching voltage of inverter 19, then the output of inverter 19 will switch to a logic high. Note that this switching event is incorrect because the output of inverter 19 should not transition to a logic high according to the logic equation for domino logic circuit 10 stated above. Thus, an errant switching activity occurs at the output of inverter 19 as a result of charge sharing among nodes 16, 17, and 18. This charge sharing phenomenon is also graphically illustrated in FIG. 2. As shown in FIG. 2, the incorrect switching at the output of inverter 19 begins when the signal value of node 18 drops below the switching voltage (approximately 0.5 V) of inverter 19.

One solution to the problem of charge sharing is by providing additional precharge transistors, similar to precharge transistor 21, to nodes 16 and 17 of domino logic circuit 10. The function of these additional precharge transistors is to pull-up nodes 16 and 17 during the precharge cycle of the circuit operation. This will remove any possibility of charge sharing from node 18 by nodes 16 and 17 during an input condition similar to the one described supra.

Another solution to the problem of charge sharing is to fabricate domino logic circuit 10 utilizing the so-called silicon on insulator (SOI) processing technology. With SOI technology, most of the parasitic capacitance on nodes 16 and 17 will be removed automatically. Specifically, the majority of the capacitance on nodes 16 and 17, which arises from the diffusion area created by input transistors 11, 12 (for node 16) and input transistors 13–15 (for node 17), will be lessened due to the SOI technology. The parasitic capacitance may be reduced by at least ⅔, leaving, at most, ⅓ of the parasitic capacitance of the CMOS bulk counterpart.

Body connections are ordinarily not included within transistors fabricated with the SOI technology; that is, the p-substrate connection for an n-channel and the n-well connection for a p-channel are ordinarily not included. With its body connection omitted, an SOI transistor's body voltage is allowed to float, and this may create another problem for domino logic circuit 10. Since the threshold voltage ($V_t$) of a transistor is a function of a source-to-body voltage, the fact that a transistor's body voltage is floating will cause an unknown component to the current through the transistor because the transistor current is dependent on the threshold voltage. That is, the transistor current increases as the threshold voltage decreases, and the threshold voltage decreases as the source-to-body voltage decreases. To deal with this problem, it is desirable to pre-condition the body voltage of all the input transistors within domino logic circuit 10. This will increase the transistor current flowing through the input transistors when a switching event occurs. The body voltage may be pre-conditioned by adding a body connection that is ordinarily omitted.

Figure 3:
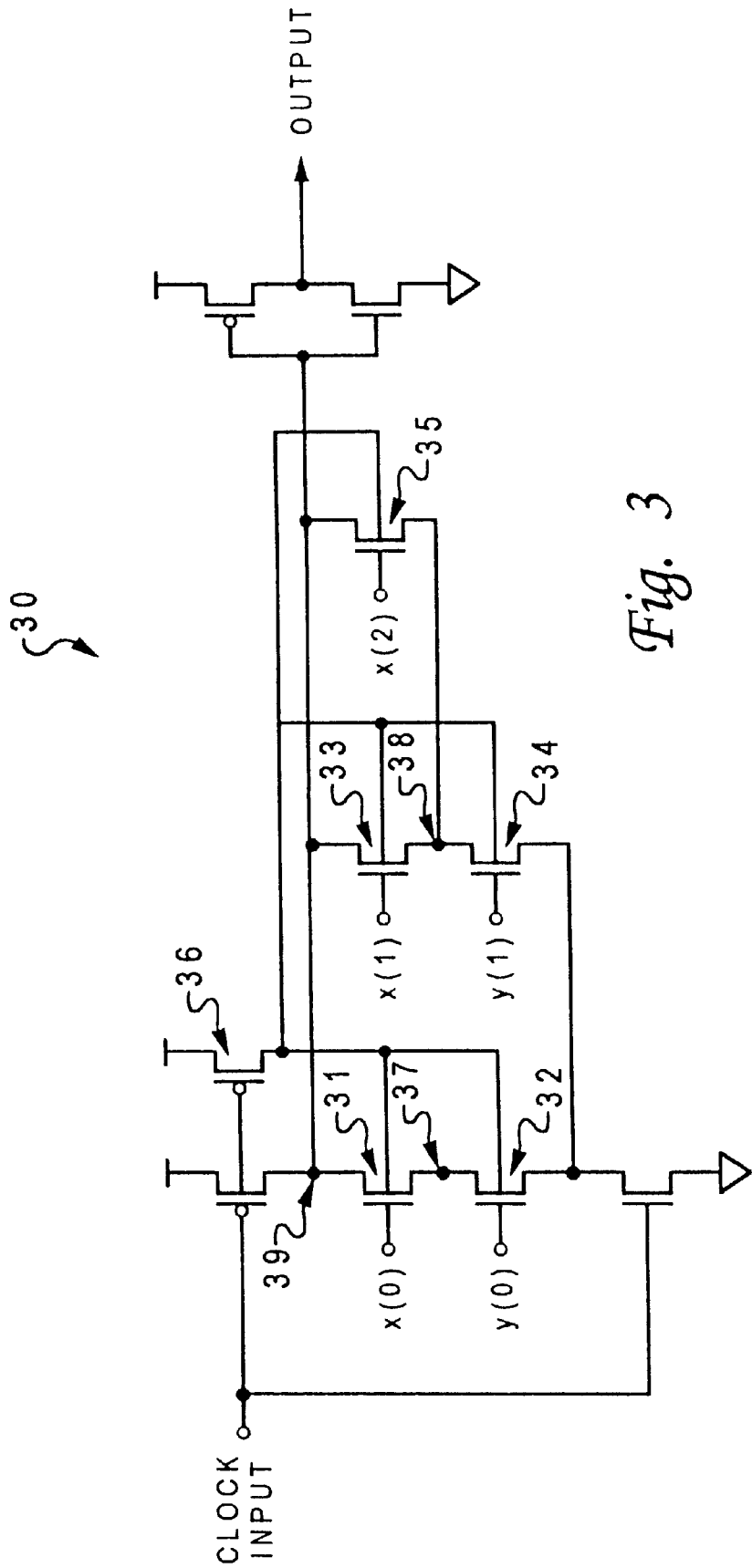
FIG. 3 is a circuit diagram of a five-input SOI domino logic circuit, in accordance with a preferred embodiment of the present invention.

Referring now to FIG. 3, there is illustrated a circuit diagram of a five-input SOI domino logic circuit, in accordance with a preferred embodiment of the present invention. Similar to circuit 10 from FIG. 1, circuit 30 includes a p-channel supplemental precharge transistor 36. The gate of precharge transistor 36 is connected to a clock input, the source of precharge transistor 36 is connected to $V_{dd}$, and the drain of precharge transistor 36 is connected to the body of each of input transistors 31–35. As shown, all the body nodes of input transistors 31–35 are in effect tied together, and as a result, the load on precharge transistor 36 will be increased.

Figure 4:
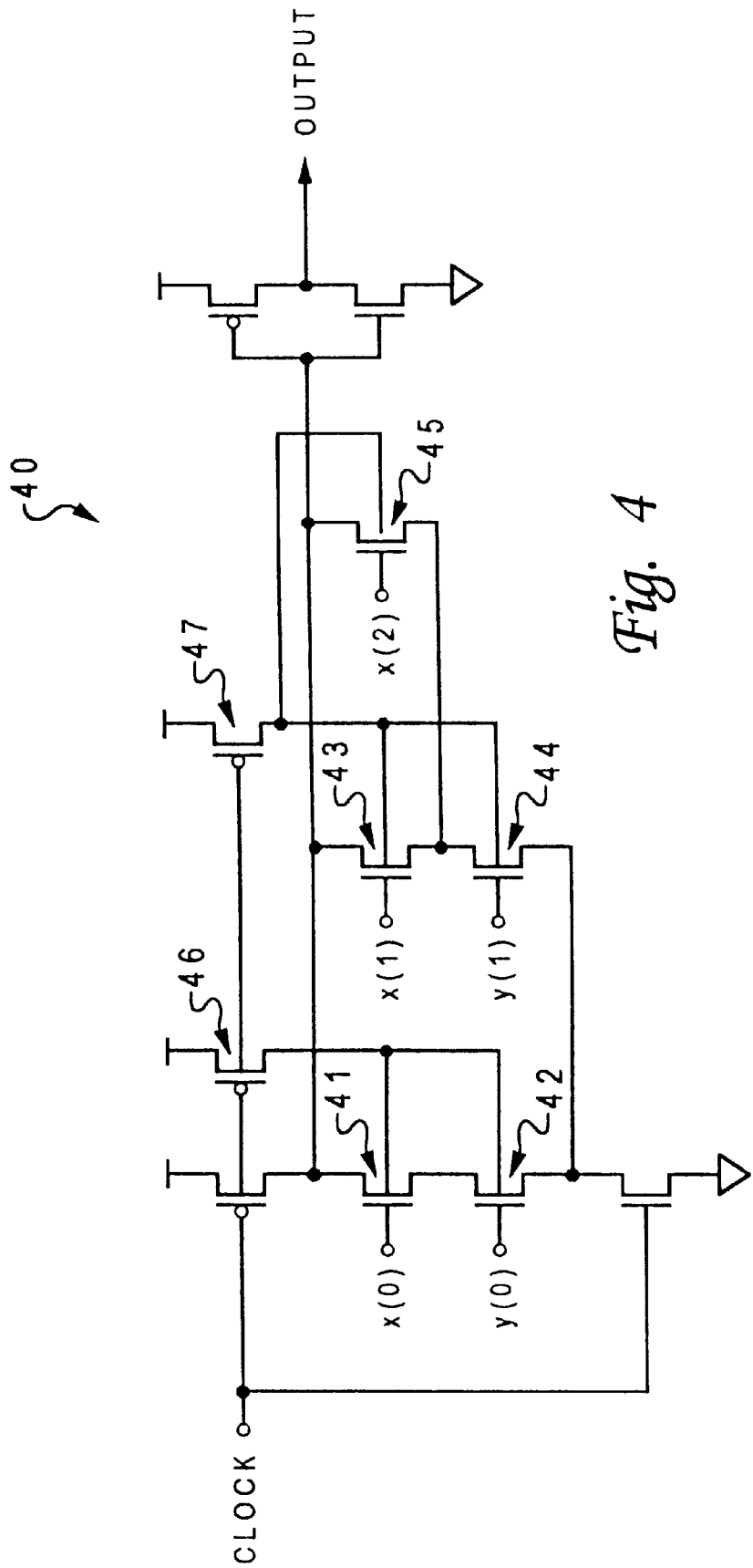
FIG. 4 is a circuit diagram of a five-input SOI domino logic circuit, in accordance with an alternative embodiment of the present invention.

With reference now to FIG. 4, there is illustrated a circuit diagram of a five-input SOI domino logic circuit, in accordance with an alternative embodiment of the present invention. Circuit 40 is almost identical to circuit 30 from FIG. 3. The only addition is another supplemental p-channel precharge transistor 47. The gate of each of precharge transistors 46, 47 is connected to a clock input while the source of each of precharge transistors 46, 47 is connected to $V_{dd}$. The drain of precharge transistor 46 is only connected to the bodies of input transistors 41–42, and the drain of precharge transistor 47 is only connected to the bodies of input transistors 43–45. As such, the body connections of the left and right evaluate tree portions are separated. This configuration permits independent movement of the body nodes in input transistors 41–42 and input transistors 43–45, which may or may not be desirable or necessary.

Accordingly, it should be understood that further modifications to this configuration can easily be applied. For example, it is well-known to omit a discharge transistor (such as the n-channel transistor that receives clock signal in circuit 40 in FIG. 4) in a domino logic circuit. Also, any number of supplemental precharge transistors can be similarly added to precharge any number of input transistor bodies independently or in any group combination.

Figure 5:
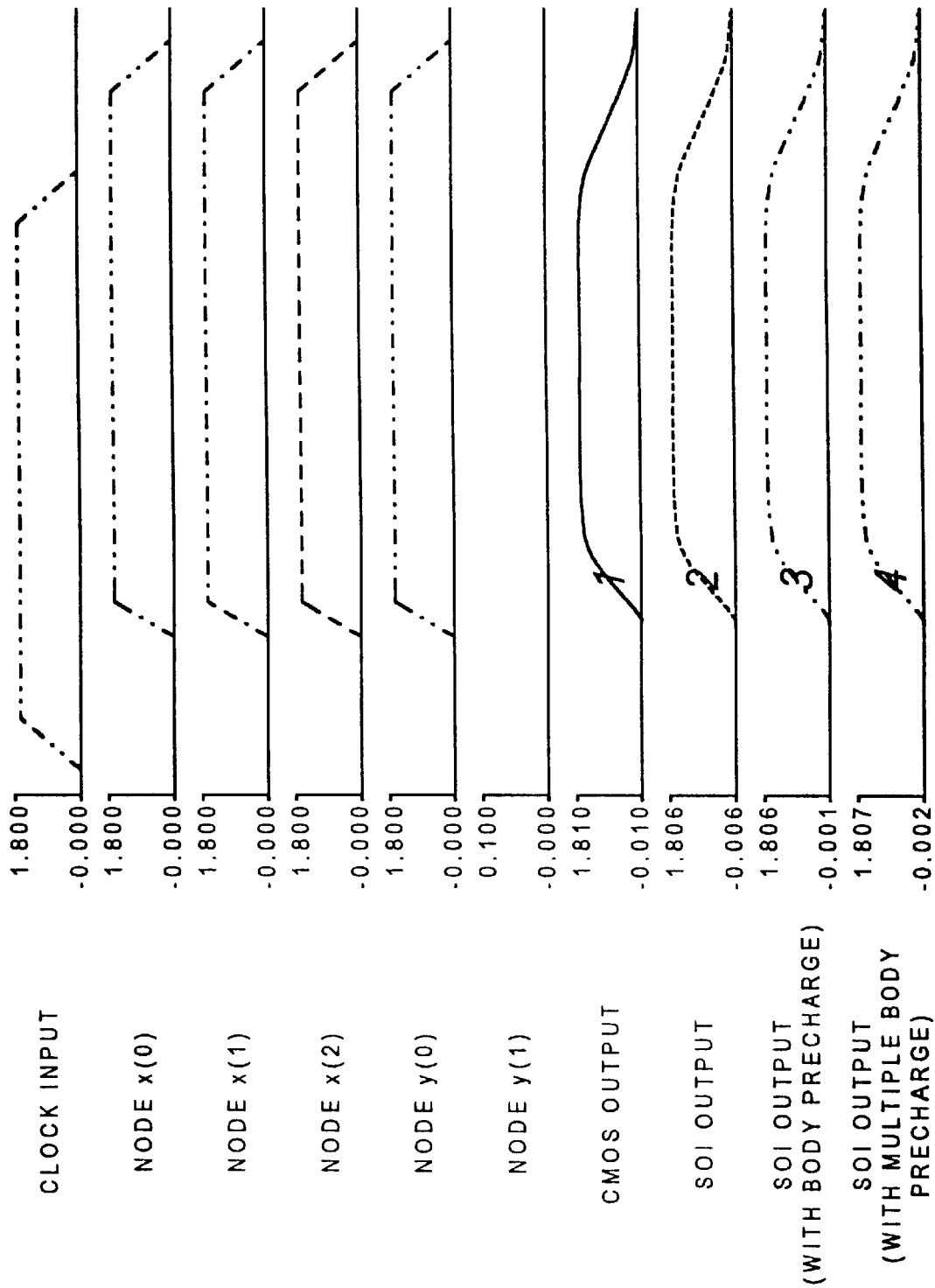
FIG. 5 is an exemplary timing diagram for the five-input SOI domino logic circuit from FIG. 3.

With this technique, a performance increase can readily be observed. Referring now to FIG. 5, there is illustrated an exemplary timing diagram for the five-input SOI domino logic circuit from FIG. 3. In this example, the output switching event is triggered by the switching of nodes x(0) and y(0). Note that inputs x(1) and x(2) also switch, but that node y(1) remains low. This has the effect of requiring input transistors 31 and 32 to pull down the parasitic capacitance at node 38 in addition to the capacitance at nodes 37 and 39, which provides a worst-case delay situation.

Various delays from the inputs switching events to the outputs are also illustrated in FIG. 5. The CMOS output signal refers to the output signal of the domino logic circuit from FIG. 1 fabricated using CMOS technology. The SOI output signal refers to the output signal of the domino logic circuit from FIG. 1 realized in SOI technology but without precharging the body node of all input transistors. The second SOI output signal refers to the output signal of the domino logic circuit from FIG. 3 fabricated using SOI technology where the body nodes of all input transistors are precharged by a single supplemental precharge transistor. The third SOI output signal refers to the output signal of the domino logic circuit from FIG. 4 where two separate supplemental precharge transistors are utilized. A summary for the output delays in each of the above-mentioned cases is shown in Table I.

TABLE I

| Circuit Type | Delay/ps | decrease over CMOS | decrease over non-precharged body |
|---|---|---|---|
| CMOS | 188 | — | — |
| SOI without precharged body | 169 | 10.1% | — |
| SOI with common precharged body | 143 | 23.9% | 15.4% |
| SOI with separate precharged body | 143 | 23.9% | 15.4% |

In summary, the use of SOI technology reduced the output delay for the domino logic circuit by 19 picoseconds, or 10.1%. Additionally, the body precharging of the SOI domino logic circuits decreases the output delay by an additional 26 picoseconds. This represents a total reduction in output delay of 23.9% over the CMOS technology and 15.4% over SOI domino logic circuits without body-precharged.

As has been described, the present invention provides an improved domino logic circuit utilizing SOI technology. With CMOS technology, the parasitic capacitance on internal nodes between input transistors of a domino logic circuit is generally quite large. With SOI technology, most of the parasitic capacitance on internal nodes is removed.

As discussed above, it is desirable to pre-charge the body voltage of all the input transistors within a SOI domino logic circuit because doing so increases the current through the input transistors when a switching event occurs. Although SOI processing technology is utilized throughout this disclosure to illustrate the present invention, it is understood by those skilled in the art that the principle taught herein may also be applicable to all similar processing technologies including, without limitation, silicon on sapphire (SOS).

While the invention has been particularly shown and described with reference to a preferred embodiment, it will be understood by those skilled in the art that various changes in form and detail may be made therein without departing from the spirit and scope of the invention.

What is claimed is:

1. A domino logic circuit, comprising:
   a precharge transistor connected to a power supply, wherein said precharge transistor receives a clock input;
   at least one input transistor coupled to said precharge transistor, wherein said at least one input transistor receives a signal input; and
   a supplemental precharge transistor connected to said power supply and to a body of said at least one input transistor, wherein said supplemental precharge transistor also receives said clock input.

2. The domino logic circuit according to claim 1, wherein said domino logic circuit is fabricated by silicon on insulator processing technology.

3. The domino logic circuit according to claim 1, wherein said precharge transistor and said supplemental precharge transistor are p-channel transistors while said one or more input transistors are n-channel transistors.

4. The domino logic circuit according to claim 1, wherein said domino logic circuit further includes an n-channel discharge transistor connected to ground, wherein said discharge transistor receives said clock input.

5. The domino logic circuit according to claim 1, wherein said domino logic circuit further includes an inverter.

6. The domino logic circuit according to claim 5, wherein said inverter includes a p-channel transistor and an n-channel transistor connected in series.

7. The domino logic circuit according to claim 5, wherein said domino logic circuit further includes a second supplement precharge transistor connected to said power supply and to a body of some of said at least one input transistors.

8. A domino logic circuit, comprising:
   a precharge transistor for receiving a clock input, said precharge transistor having a source connected to a power supply;
   a discharge transistor for receiving said clock input, wherein said discharge transistor having a source connected to ground;
   a plurality of input transistors coupled between a drain of said precharge transistor and a drain of said discharge transistor, wherein each of said plurality of input transistors receives a signal input; and
   a supplemental precharge transistor having a source connected to said power supply and a drain connected to a body of each of said plurality input transistors, wherein said supplemental precharge transistor also receives said clock input.

9. The domino logic circuit according to claim 8, wherein said domino logic circuit is fabricated by silicon on insulator processing technology.

10. The domino logic circuit according to claim 8, wherein said precharge transistor and said supplemental precharge transistor are p-channel transistors while said one or more input transistors and said discharge transistor are n-channel transistors.

11. The domino logic circuit according to claim 8, wherein said domino logic circuit further includes an inverter.

12. The domino logic circuit according to claim 11, wherein said inverter includes a p-channel transistor and an n-channel transistor connected in series.

13. The domino logic circuit according to claim 11, wherein said domino logic circuit further includes a second supplement precharge transistor connected to said power supply and to a body of some of said plurality of input transistors.

14. A domino logic circuit, comprising:
   a precharge transistor connected to a power supply, wherein said precharge transistor receives a clock input;
   a discharge transistor connected to ground, wherein said discharge transistor receives said clock input;
   one or more input transistors coupled between said precharge transistor and said discharge transistor, wherein each of said one or more input transistors receives a signal input; and
   a plurality of supplemental precharge transistors connected to said power supply, wherein each of said plurality of supplemental precharge transistors is connected to a body of a group of said one or more input transistors, wherein said supplemental precharge transistor also receives said clock input.

15. The domino logic circuit according to claim 14, wherein said domino logic circuit is fabricated by silicon on insulator processing technology.

16. The domino logic circuit according to claim 14, wherein said precharge transistor and said supplemental precharge transistor are p-channel transistors while said one or more input transistors and said discharge transistor are n-channel transistors.

17. The domino logic circuit according to claim 14, wherein said domino logic circuit further includes an inverter.

18. The domino logic circuit according to claim 17, wherein said inverter includes a p-channel transistor and an n-channel transistor connected in series.

* * * * *

UNITED STATES PATENT AND TRADEMARK OFFICE
CERTIFICATE OF CORRECTION

PATENT NO. : 6,049,230
DATED : April 11, 2000
INVENTOR(S) : Durham et al.

It is certified that error appears in the above-identified patent and that said Letters Patent are hereby corrected as shown below:

Column 5, line 66, please change "claim 5" to –claim 1–.

Column 6, line 33, please change "claim 11" to –claim 8–.

Signed and Sealed this

Twenty-second Day of May, 2001

Attest:

NICHOLAS P. GODICI

*Attesting Officer*     Acting Director of the United States Patent and Trademark Office